United States Patent
Shimizu

(10) Patent No.: US 7,180,750 B2
(45) Date of Patent: Feb. 20, 2007

(54) STRUCTURE FOR PREVENTING STACKING CONNECTORS ON BOARDS FROM COMING APART AND ELECTRONIC DEVICE

(75) Inventor: Masahito Shimizu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/227,135

(22) Filed: Sep. 16, 2005

(65) Prior Publication Data

US 2006/0061980 A1 Mar. 23, 2006

(30) Foreign Application Priority Data

Sep. 21, 2004 (JP) ............................. 2004-273676

(51) Int. Cl.
*H01R 12/00* (2006.01)
*H05K 7/12* (2006.01)

(52) U.S. Cl. ...................... 361/787; 361/785; 361/789; 439/73

(58) Field of Classification Search ................. 361/787, 361/749, 814, 784, 785, 789, 807; 439/73
See application file for complete search history.

(56) References Cited

U.S. PATENT DOCUMENTS

| | | | | |
|---|---|---|---|---|
| 2,925,537 | A | * | 2/1960 | Winkler ........................ 361/790 |
| 4,289,364 | A | | 9/1981 | Strom et al. |
| 4,563,725 | A | * | 1/1986 | Kirby ........................... 361/708 |
| 4,945,401 | A | * | 7/1990 | Trunk et al. ................. 257/718 |
| 5,109,318 | A | * | 4/1992 | Funari et al. ................. 361/710 |
| 5,209,671 | A | * | 5/1993 | Sugimoto et al. ............. 439/67 |
| 5,268,820 | A | * | 12/1993 | Tseng et al. ................. 361/785 |
| 5,309,181 | A | * | 5/1994 | Ota et al. ..................... 346/145 |
| 5,499,160 | A | * | 3/1996 | Burns ........................... 361/706 |
| 5,888,076 | A | | 3/1999 | Itoh et al. |
| 5,967,799 | A | | 10/1999 | Arai |
| 5,980,275 | A | * | 11/1999 | Beaman et al. ................. 439/92 |
| 6,297,966 | B1 | * | 10/2001 | Lee et al. ..................... 361/799 |
| 6,312,263 | B1 | | 11/2001 | Higuchi et al. |
| 6,465,728 | B1 | * | 10/2002 | McLaughlin et al. ....... 174/16.3 |
| 6,567,275 | B1 | * | 5/2003 | Hou et al. ................... 361/807 |
| 6,603,669 | B2 | * | 8/2003 | Sheen et al. ................. 361/801 |
| 6,813,163 | B2 | * | 11/2004 | Inoue et al. ................. 361/784 |
| 7,004,764 | B2 | * | 2/2006 | Boudreau et al. ............. 439/74 |
| 2002/0135993 | A1 | * | 9/2002 | Ueyama et al. ............. 361/814 |
| 2005/0110934 | A1 | * | 5/2005 | Lee ............................. 349/149 |

FOREIGN PATENT DOCUMENTS

| | | |
|---|---|---|
| EP | 0 506 445 A | 9/1992 |
| JP | 4-111153 | 9/1992 |
| JP | 07-183058 | 7/1995 |
| JP | 10-092490 | 4/1998 |
| JP | 11-121109 | 4/1999 |
| JP | 2001-110488 | 4/2001 |
| JP | 2001-126810 | 5/2001 |
| WO | WO 03/065513 A | 8/2003 |
| WO | WO 03/084002 A | 10/2003 |

\* cited by examiner

*Primary Examiner*—Tuan Dinh
*Assistant Examiner*—Dameon E. Levi
(74) *Attorney, Agent, or Firm*—Foley & Lardner LLP

(57) ABSTRACT

A structure is disclosed for preventing stacking connectors on a first and a second boards from coming apart that are fitted to each other. The first and second boards connected by said stacking connectors being fitted to each other are clamped by a clamping member. The clamping member is connected to surfaces on the first and second boards that connect to ground.

12 Claims, 3 Drawing Sheets

STRUCTURE FOR PREVENTING STACKING CONNECTORS ON BOARDS FROM COMING APART AND ELECTRONIC DEVICE

BACKGROUND OF THE INVENTION

1. Field of the Invention

The present invention relates to a structure for preventing stacking connectors on boards from coming apart, and to an electronic device having this structure.

2. Description of the Related Art

Heretofore, for preventing stacking connectors on boards from coming apart due to shocks, vibrations and the like, structures have been known in the art wherein stacking connectors are retained by device housing or by cushion members that are disposed at required locations inside the housing. Also, JP-A-2001-126810 discloses stacking connectors comprising a locking mechanism which prevents the stacking connectors that are fitted together from moving in a direction in which one comes off from the other, as a means to prevent dislodgement.

However, the former approach involves wasted space that is not used to mount parts therein owing to the structure that retains the stacking connectors. For example, when cushion members are used, space between the stacking connectors will be filled up only with the cushions. The latter approach, on the other hand, has the drawback that it is necessary to provide special stacking connectors and to make an extra connection to ground, as will be later described.

A foldable radio communications device such as a portable telephone can be constructed using stacking connectors with a flexible printed circuit board interposed between a board for a liquid crystal display and a board for a keyboard. In this case, a connection is also made to ground in order to prevent the flexible printed circuit board from acting as a floating metal substance to adversely affect the antenna characteristics. This connection to ground is typically made by soldering of the flexible printed circuit board, a conductive tape or the like. But these are not desirable from the standpoint of working costs and workability. The conductive tape also has the problem that it cannot be reused.

SUMMARY OF THE INVENTION

It is an object of the present invention to provide a structure which is capable of preventing stacking connectors on boards from coming apart, and also capable of making a connection to ground.

It is another object of the present invention to provide an electronic device having such a structure.

To this end, in accordance with the present invention, there is provided a structure for preventing stacking connectors on a first and a second boards from coming apart that are fitted to each other, wherein the first and second boards connected by the stacking connectors being fitted to each other are clamped by a clamping member, the clamping member being connected to surfaces on the first and second boards that connect to ground.

The present invention assures that the stacking connectors is prevented from coming apart with a simple structure, and also improves efficiency in mounting parts, workability, antenna characteristics, and resistance to electrostatic breakdown.

The clamping member may be a clip member made of a metal. The use of the clip member facilitates handling and enables its reuse.

The structure may further comprise a stop member for deterring the clamping member from dropping. In this case, the stop member may preferably be held by a stationary frame member.

A gap of a predetermined width may preferably be provided between the stop member, the frame member and the clamping member.

The above and other objects, features and advantages of the present invention will become apparent from the following description with reference to the accompanying drawings which illustrate examples of the present invention.

DETAILED DESCRIPTION OF THE PREFERRED EMBODIMENTS

A description will hereinafter be given of an embodiment in which the present invention is applied to a foldable portable telephone.

Figure 1:
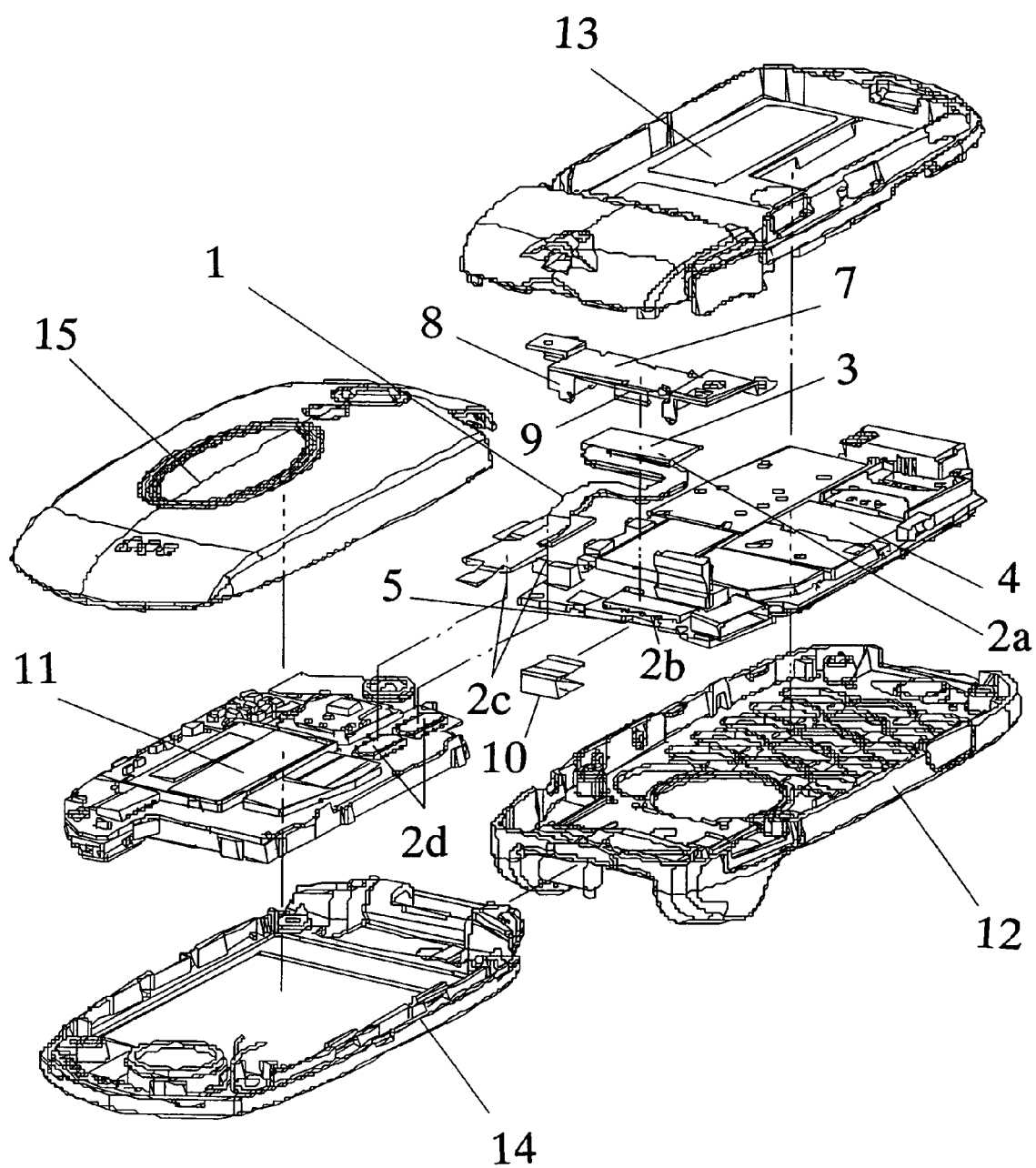
FIG. 1 is an exploded perspective view of a portable telephone according to one embodiment of the present invention.

Referring first to FIG. 1, the general configuration of a foldable portable telephone that employs a fixing structure for stacking connectors according to the present invention is illustrated. The foldable portable telephone illustrated in FIG. 1 mainly comprises a button manipulation section which includes front case 12 for accommodating board 4 for a keyboard and rear cover 13, and a liquid crystal display section which includes front case 14 for accommodating board 11 for a liquid crystal display and rear cover 15. Further, flexible printed circuit board 1 is arranged between board 4 for the keyboard and board 11 for the liquid crystal display. Flexible printed circuit board 1 is secured at one end to stacking connector 2a to be fitted into stacking connector 2b on board 4 for the keyboard, and at the other end to stacking connector 2c to be fitted into stacking connector 2d on board 11 for the liquid crystal display. Stacking connectors 2a and 2c are coupled together via a flexible strip member. Board 4 for the keyboard is electrically connected to sub-board 7 which is fixed to board 4 through frame 8.

Figure 2:
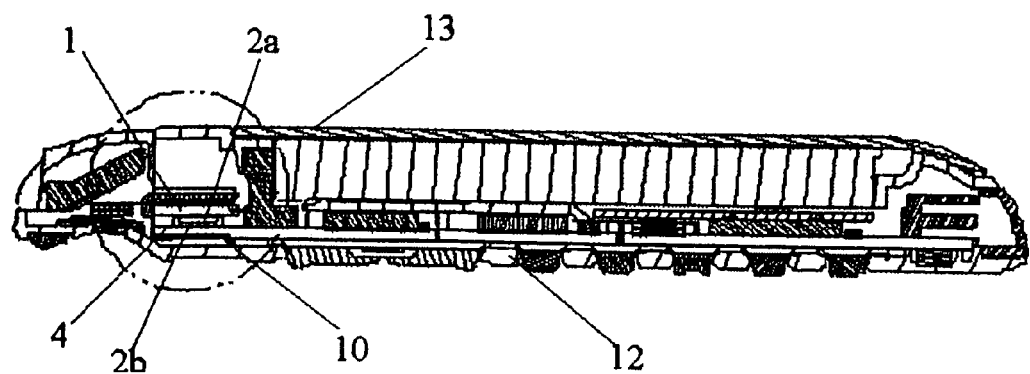
FIG. 2 is a vertical sectional view of a keyboard of the portable telephone illustrated in FIG. 1.
Figure 3:
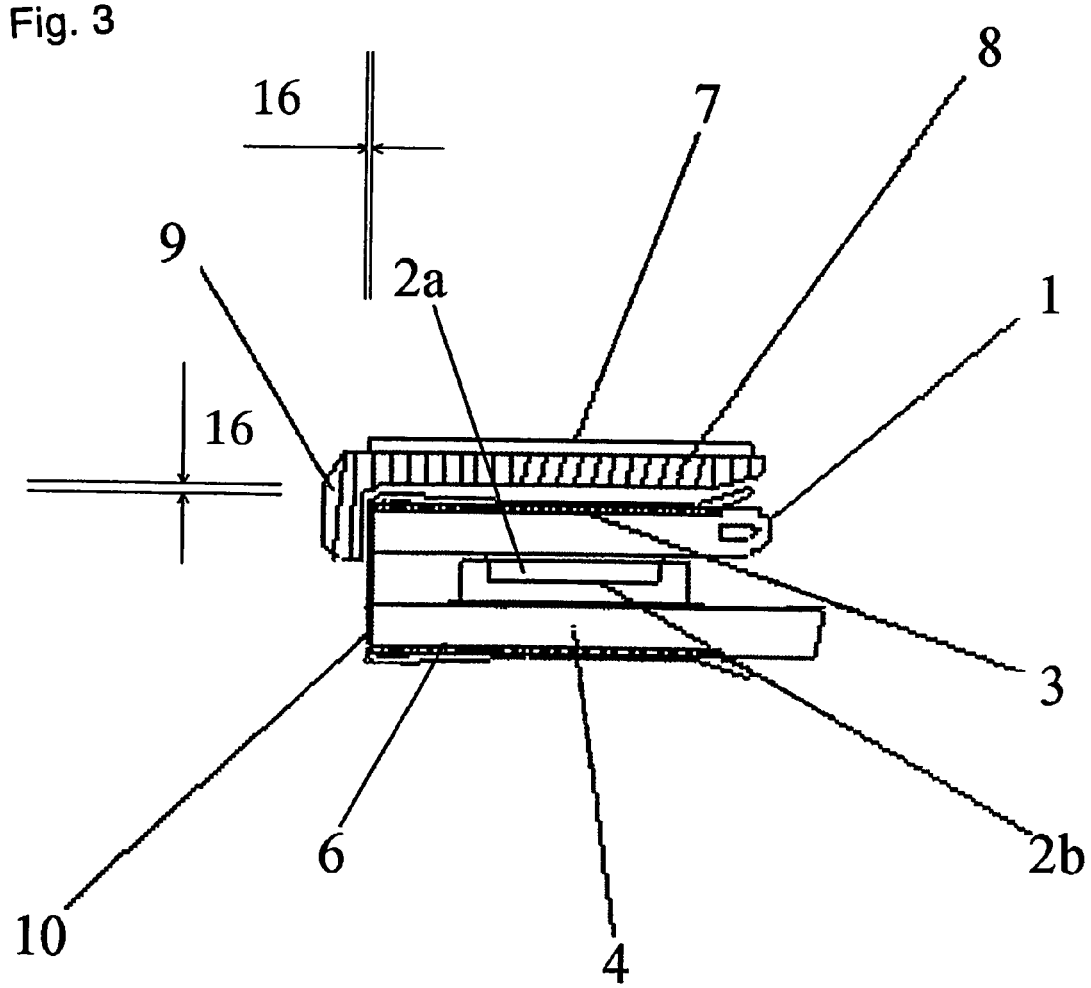
FIG. 3 is an enlarged view of a structure for preventing stacking connector on the keyboard from coming apart.

Next, referring to FIGS. 2 and 3, a structure will be described for preventing the stacking connectors that connect board 1 with board 4, also shown in FIG. 1, from coming apart. After the terminals of a pair of stacking connectors 2a, 2b have been fitted to each other, clip 10 is mounted to clamp both board 4 for the keyboard and flexible printed circuit board 1 (see FIG. 4). Clip 10 is a conductive, resilient metal member and is generally U-shaped with upper and lower clamping portions each having a predetermined width, and a connecting portion which connects the clamping portions.

Frame 8 serves to fix sub-board 7 and is provided with stop member 9 in the form of a claw-like protrusion to prevent clip 10 from popping out or dropping therefrom. The stop member is configured such that when clip 10 slides toward stop member wall, a side end (closed end) of clip 10 is caused to abut against the stop member to prevent clip 10 from dropping. Provided between frame 8 and stop member 9 and clip 10 is gap 16 of a predetermined width which ensures that shocks and vibrations will not be transmitted to stacking connectors 2a, 2b, when an external force is exerted to the portable telephone or when the portable telephone is dropped. Thus, clip 10 will not slide or come off due to external forces, shocks, vibrations or the like.

Flexible printed circuit board 1 is further provided with surface 3 that connect to ground plane, in a region of the top surface thereof with which clip 10 comes into contact, and board 4 for the keyboard is likewise provided with surface 6 that connects to ground, in a region of the bottom surface thereof with which clip 10 comes into contact, thereby also making a connection to ground through mounting clip 10.

Figure 4:
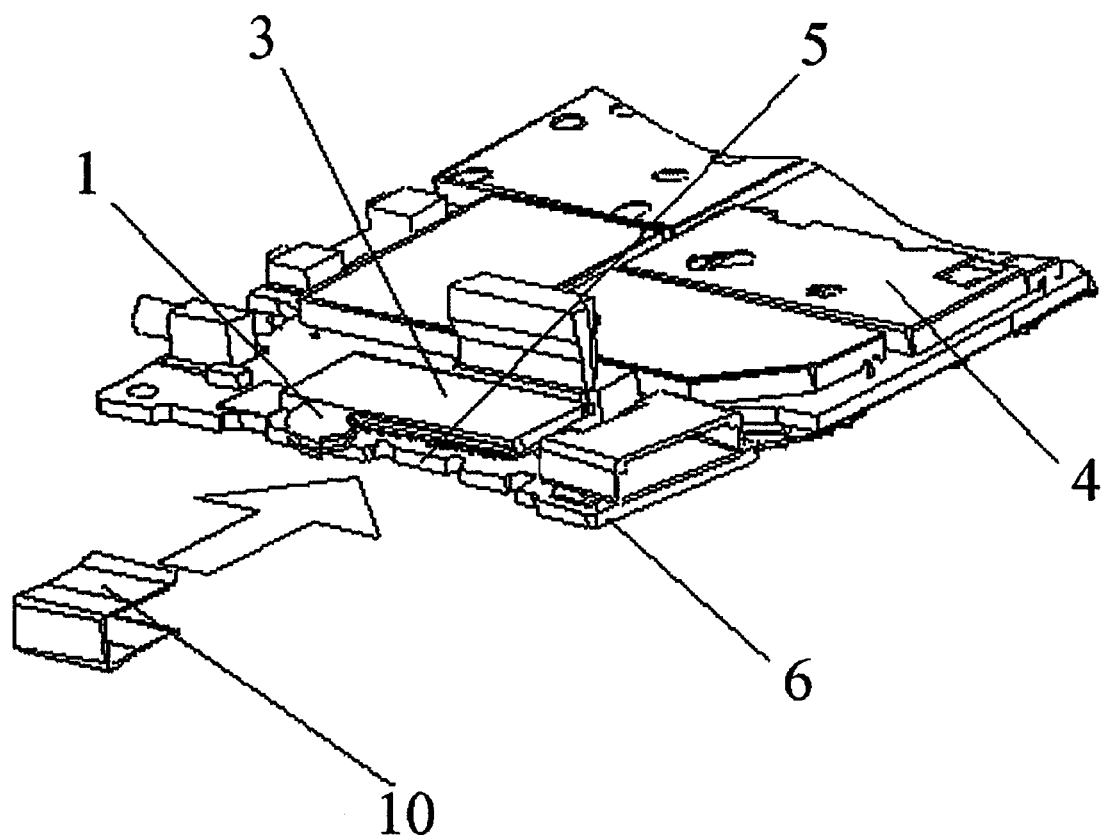
FIG. 4 is a view illustrating attachment of a clip.

Next, referring to FIG. 4, in conjunction with FIGS. 1 to 3, a procedure will be described for assembling the structure to prevent the stacking connectors from coming apart. First, stacking connector 2a on flexible printed circuit board 1 is fitted into stacking connector 2b on board 4 for the keyboard. FIG. 4 represents a state in which stacking connectors 2a, 2b are fitted to each other. Then, clip 10 is attached to clamp both flexible printed circuit board 1 and board 4 for the keyboard, by using cutout 5 for positioning, cutout 5 being provided on board 4.

Subsequently, after sub-board 7, which is electrically connected to board 4 for the keyboard, is fixed to frame 8, as illustrated in FIG. 1, frame 8 is brought into engagement with the top surface of stacking connector 2a on board 4 for the keyboard. Thereafter, the other stacking connector 2c on flexible printed circuit board 1 is fitted into stacking connector 2d on board 11 for the liquid crystal display. These electrically connected boards are assembled into front cases 12, 14, and rear covers 13, 15 are fitted on front cases 12, 14, respectively, thereby completing the assembling procedure.

As is apparent from the foregoing description, stacking connectors 2a, 2b can be prevented from coming apart by clamping flexible printed circuit board 1 and board 4 for the keyboard with clip 10. It is also possible to deter the stacking connectors from dropping and to improve the antenna characteristics and resistance to electrostatic breakdown by positively connecting surfaces 3 and 6 of flexible printed circuit board 1 and board 4 for the keyboard with conductive clip 10.

Also, in addition to the ability to improve the workability, the configuration illustrated in the foregoing embodiment solves the problem of reusability, as compared with a conventional connection to ground which is made by soldering, conductive tape or the like. Furthermore, the configuration illustrated in the foregoing embodiment also makes it possible to improve efficiency in mounting parts because space for mounting parts is secured on the stacking connector by utilizing the frame.

Also, in the foregoing embodiment, a configuration is employed wherein cutout 5 is provided on one end of board 4 for the keyboard, in order to improve workability. However, board 4 for the keyboard may be provided with a recess into which clip 10 fits, or flexible printed circuit board 1 may be provided with a similar cutout, groove, or printed pattern. These may be omitted if it is recognized that the workability is not much affected, as a matter of course. In addition, the tip of the clip may be configured to fit into such a recess, groove or the like, to prevent drop or slide of the clip.

While the foregoing embodiment has been described by way of example in which a gap is provided between frame 8 and clip 10, the width of the gap may be set depending on the device which employs a structure for preventing the stacking connectors from coming apart, and may be zero as required. Alternatively, a deformable spacer member, preferably made of a cushioning material, may be arranged between frame 8 and clip 10.

While the foregoing description has been given of an embodiment in which the present invention is applied to a portable telephone, the present invention can be equally applied to electronic devices, including personal computers and PDA's (Personal Digital Assistant), which include a structure for connecting a plurality of boards (irrespective of the type of board) using stacking connectors. Also, in view of the features of the present invention, it can be said that the present invention is more preferably applicable to a fixing structure using stacking connectors to connect a flexible printed circuit board to other boards (irrespective of whether the boards are rigid or flexible).

While preferred embodiments of the present invention have been described using specific terms, such description is for illustrative purposes only, and it is to be understood that changes and variations may be made without departing from the spirit or scope of the following claims.

What is claimed is:

1. A structure for preventing stacking connectors on a first and a second board from coming apart once they have been fitted to each other, each of said first and second boards having a first surface with a respective stacking connector positioned thereon and a second surface opposite said first surface, said stacking connector of said first board being fitted into said stacking connector of said second board, each of said second surfaces of said first and second boards having a first region that connects to ground, said structure comprising:

a clamping member for clamping said first and second boards, said clamping member being connected to said first regions of said second surfaces of said first and second boards that connect to ground; and a stop member for deterring said clamping member from dropping;

wherein a gap of a predetermined width is provided between said stop member and said clamping member;

wherein said clamping member is composed of a resilient material in a U-shaped, said clamping member comprising an upper clamping portion, a lower clamping portion substantially parallel to said upper clamping portion, and a connecting portion connecting a first end of said upper clamping portion to a first end of said lower clamping portion;

wherein said upper clamping portion comprises a second end distal to the first end, said second end comprising a winged tip curving away from the lower clamping portion;

wherein said lower clamping portion comprises a second end distal to the first end, said second end comprising a winged tip curving away from the upper clamping portion; and, wherein said upper clamping portion and lower clamping portion of the clamping member clamp the first and second boards together using a bias afforded by the resiliency of the resilient material.

2. The structure according to claim 1, wherein said clamping member is a clip member made of a metal.

3. The structure according to claim 1, wherein said stop member is held by a stationary frame member which retains a third board.

4. The structure according to claim 3, wherein a particular gap of a particular predetermined width is provided between said frame member and said clamping member.

5. The structure according to claim 3, further comprising a spacer member disposed between said stop member and said frame member and said clamping member.

6. An electronic device, comprising:
- a first board having a first surface with a respective stacking connector positioned thereon and a second surface opposite said first surface, a first region of said second surface of said first board being connected to ground;
- a second board having a first surface with a respective stacking connector positioned thereon and a second surface opposite said first surface, a first region of said second surface of said second board being connected to ground, said stacking connector of said first board being fitted into said stacking connector of said second board;
- a clamping member for clamping said first board and said second board, said clamping member in contact with said first region of said second surface of said first board and in contact with said first region of said second surface of said second board; and
- a frame having a stop member;
- wherein said clamping member is a clip;
- wherein said clip is U-shaped with an upper clamping portion in contact with said first region of said second surface of said first board, a lower clamping portion in contact with said first region of said second surface of said second board, and a connecting portion that connects said upper clamping portion and said lower clamping portion;
- wherein said clip is composed of a resilient material and said upper clamping portion and said lower clamping portion of the clip clamp the first and second boards together using a bias afforded by the resiliency of said resilient material;
- wherein the frame is positioned such that, if said clip slides toward said stop member, said connecting portion of said clip abuts against said stop member so that said clip is prevented from popping out; and
- wherein said frame is further positioned such that a gap of a predetermined width is provided between said frame and said clip.

7. The electronic device according to claim 6, wherein said second board is a board for a main body of the electronic device, and said first board is a flexible board for electrically connecting said second board with a board for a liquid crystal display device, said liquid crystal display device being pivotally mounted via a hinge structure.

8. The electronic device of claim 6,
wherein said clamping member prevents said stacking connector of said first board from coming apart from said stacking connector of said second board.

9. The electronic device of claim 6, further comprising:
a deformable spacer member positioned between said frame and said clip.

10. The electronic device of claim 6, wherein the clamping member comprises metal.

11. The electronic device of claim 6, further comprising:
an antenna for performing radio communication.

12. The electronic device of claim 6, wherein the electronic device is a foldable portable telephone.

* * * * *